(12) United States Patent
Lechner et al.

(10) Patent No.: US 6,888,358 B2
(45) Date of Patent: May 3, 2005

(54) SENSOR AND SIGMA-DELTA CONVERTER

(75) Inventors: Moritz Lechner, Zürich (CH); Andreas Martin Haeberli, Wetzikon (CH)

(73) Assignee: Sensirion AG, Zürich (CH)

(*) Notice: Subject to any disclaimer, the term of this patent is extended or adjusted under 35 U.S.C. 154(b) by 125 days.

(21) Appl. No.: 10/182,524

(22) PCT Filed: Feb. 16, 2001

(86) PCT No.: PCT/IB01/00199

§ 371 (c)(1),
(2), (4) Date: Jul. 30, 2002

(87) PCT Pub. No.: WO01/63771

PCT Pub. Date: Aug. 30, 2001

(65) Prior Publication Data

US 2003/0090277 A1 May 15, 2003

(30) Foreign Application Priority Data

Feb. 25, 2000 (CH) .................................. 377/00

(51) Int. Cl.[7] .......................... G01R 27/02; G01N 27/02
(52) U.S. Cl. ........................................ 324/607; 324/444
(58) Field of Search ............................... 324/447, 519, 324/548, 658, 661, 663, 664, 665, 444, 449, 686, 607, 605, 602, 600; 341/108, 115, 118, 155, 126, 143, 172

(56) References Cited

U.S. PATENT DOCUMENTS

| 4,733,171 | A | * | 3/1988 | Milkovic | 324/142 |
|---|---|---|---|---|---|
| 5,489,849 | A | * | 2/1996 | Sadoway et al. | 324/447 |
| 5,519,323 | A | * | 5/1996 | Kordas et al. | 324/444 |
| 5,657,152 | A | * | 8/1997 | Kadota | 359/305 |
| 5,659,254 | A | * | 8/1997 | Matsumoto et al. | 324/678 |
| 5,705,978 | A | | 1/1998 | Frick et al. | 340/511 |
| 5,982,221 | A | * | 11/1999 | Tuthill | 327/512 |
| 5,982,315 | A | * | 11/1999 | Bazarjani et al. | 341/143 |
| 6,128,039 | A | * | 10/2000 | Chen et al. | 348/294 |
| 6,175,641 | B1 | * | 1/2001 | Kallo et al. | 382/124 |
| 6,377,056 | B1 | * | 4/2002 | Hanzawa et al. | 324/678 |

FOREIGN PATENT DOCUMENTS

EP          0762656          3/1997          ............ H03M/1/12

* cited by examiner

*Primary Examiner*—N. Le
*Assistant Examiner*—Hoai-An D. Nguyen
(74) *Attorney, Agent, or Firm*—Donald S. Dowden; Cooper & Dunham LLP

(57) ABSTRACT

A sensor for determining at least one parameter with a sigma-delta converter (1) comprises switched input capacitors and feedback capacitors (Cf1, Cf2, Crefc1, Crefc2, Creff1, Creff2, Crt1, Crt2, Cr1, Cr2, Ctemp1, Ctemp2, Cs1, Cs2). At least one of the capacitors is designed such that its capacitance depends on the parameter to be determined. In this way, the change of capacitance can be directly determined by means of the sigma-delta converter. Due to a symmetric design of the converter a higher accuracy can be reached.

12 Claims, 5 Drawing Sheets

SENSOR AND SIGMA-DELTA CONVERTER

CROSS REFERENCE TO RELATED APPLICATIONS

This application claims the priority of Swiss patent application 0377/00, filed Feb. 25, 2000, the disclosure of which is incorporated herein by reference in its entirety.

BACKGROUND OF THE INVENTION

The invention relates to a sensor for determining at least one parameter and a sigma-delta converter.

Sensors of this type usually posses a measuring cell generating an analog voltage signal. The voltage signal is fed to a sigma-delta converter for being converted to a digital signal.

Sigma-delta converters are circuits by means of which analog signals can be converted into digital signals. They usually comprise an amplifier with feedback capacitor and input capacitors and a comparator as well as switches for switching the various capacitors with a given clock and depending on the comparator. The output signal of the comparator can be evaluated statistically by being fed to a filter, e.g. a counter. The number of pulses per time unit determined by the counter are, in most of the embodiments of such converters, proportional to the input voltage.

Usually, one of the input capacitors is connected via a first switch to the voltage to be measured, and a second one of the input capacitors is connected via a second switch to a reference voltage. By suitable operation of the converter these two voltages can be compared to each other in quantitative manner.

In order to obtain an accuracy as high as possible, sigma-delta converters are often built symmetrically and have two separated amplifier channels. Each amplifier channel has its own feedback capacitor and its own input capacitors, and the channels are being switched oppositely. The comparator compares the signals of both channels.

SUMMARY OF THE INVENTION

In an especially advantageous embodiment of a sensor with sigma-delta converter one of the capacitors of the converter is designed as a measuring capacitor the capacitance of which depends to the parameter to be measured. In a first aspect of the invention it is an object to increase the accuracy of this sensor.

According to the invention, the sigma-delta converter is designed symmetrically and possesses two oppositely switched amplifier channels, wherein at least one measuring capacitor is arranged in each channel.

The measuring capacitor can, for example, comprise a dielectric, the dielectric constant of which depends on the parameter to be measured, e.g. a humidity content.

Especially accurate measurements result if one of the input capacitors is a compensation capacitor which is being switched opposite to the measuring capacitor. Hence, the charges of both capacitors are subtracted and the voltages become smaller. Preferably, the measuring capacitor and the compensation capacitor are approximately equally large, and in particular designed in the same manner, in order to obtain a compensation that is as good as possible.

The sigma-delta converter can comprise several groups of input capacitors that are selectively connected to the amplifier input. In this way measurements with both groups can be carried out. For example, one group can be used for measuring an analog signal and the other for evaluating the measuring capacitor.

The present sensor is especially suited for measuring a gas composition, e.g. the humidity of a gas, because there are especially suited measuring capacitors for such purposes.

Calibratable sigma-delta converters with adjustable sensitivity and/or offset are used often for sensors. Hence, in a second aspect of the invention it is an object to provide a sigma-delta converter that can be calibrated accurately without complicated circuitry.

In a first embodiment of the sigma-delta converter, roughly and finely graded reference voltages are provided for calibration, which are fed into the sigma-delta converter via simultaneously or oppositely switched switches such that an addition or subtraction occurs. The roughly graded reference voltage can be regulated over a larger range than the finely graded reference voltage. In this way a much larger resolution can be achieved for a given number of grades of the reference voltages. The reference voltages can e.g. be generated by feeding voltages from a graded voltage divider to an analog mutliplexer. One end of the voltage divider should in this case be set to the working potential of the sigma-delta converter. This has the advantages that variations of this potential do not affect the measurement.

In a second embodiment of the sigma-delta converter at least one of the capacitors and/or a reference voltage is designed to be variable. For correcting the output signal according to given calibration data, the variable capacitor or the variable voltage, respectively, is varied during a measuring interval such that e.g. a part of the measuring interval is run at a first setting and another part at a second setting of the converter. Due to the compensating effect of the filter an average between both settings is measured. As a measuring period extends over many clock cycles of the converter, a very accurate calibration can be obtained by suited choice of the parts of the measuring interval even though the number of different values that the variable capacitor or the variable voltage can take is small.

Preferably at least one of the capacitors at the input or in the feedback branch of the sigma-delta converter is designed to be variable and consists e.g. of two parallel sub-capacitors. The sub-capacitors are interconnected at a first one of their terminals. The other terminal of one of the sub-capacitors is selectively connected to an input of the amplifier stage or to the ground potential. As the input of the amplifier stage is also substantially at ground potential, voltage or current peaks while switching can be avoided in this way.

BRIEF DESCRIPTION OF THE DRAWINGS

Further embodiments, advantages and applications of the invention are given in the dependent claims and the now following description by reference to the figures, which show:

WAYS FOR CARRYING OUT THE INVENTION

Figure 1:
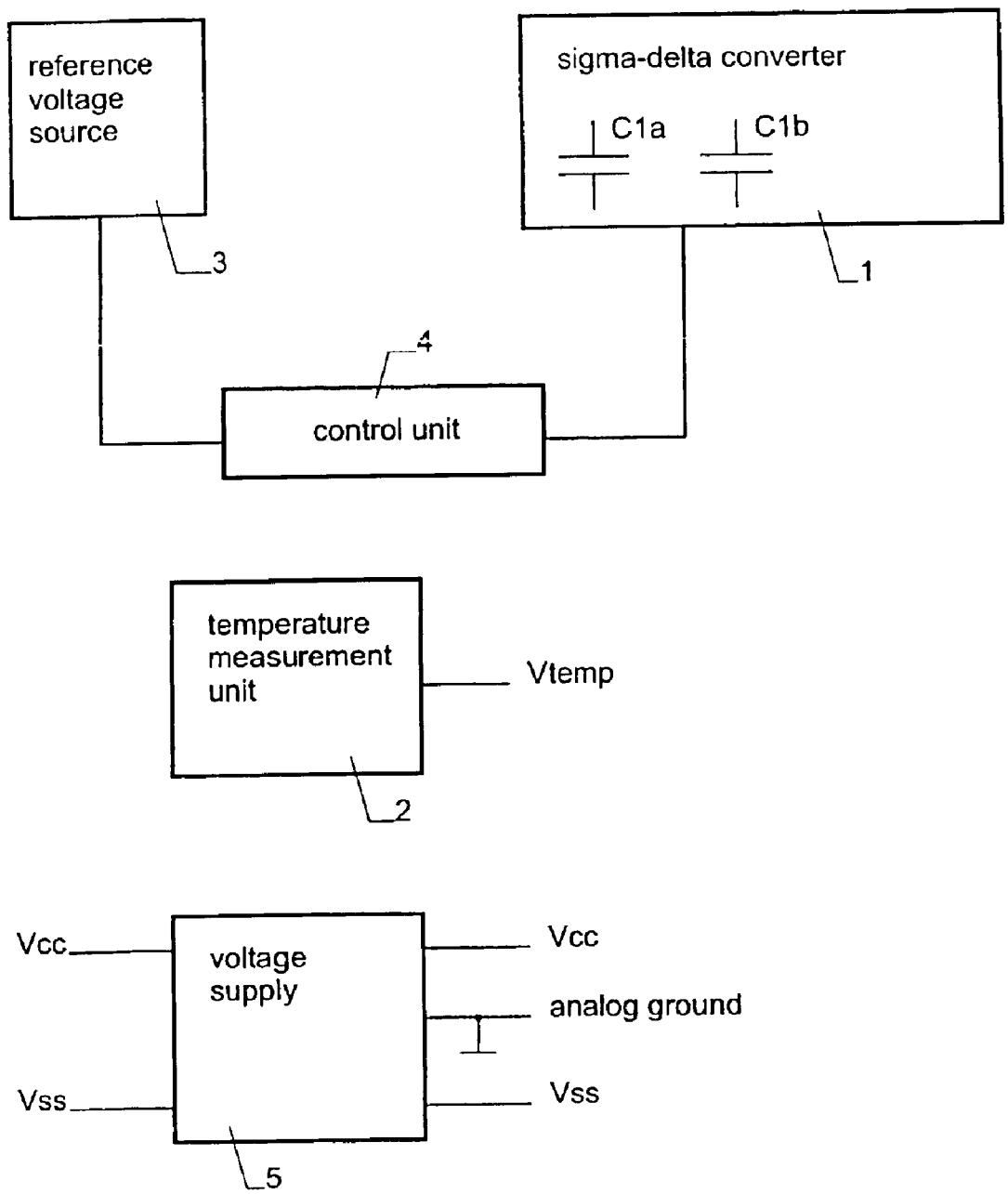
FIG. 1 a block diagram of a preferred embodiment of a sensor according to the invention, FIG. 2 the sigma-delta converter of the circuit of FIG. 1, FIG. 3 a part of the reference voltage source of the circuit of FIG. 1, FIG. 4 a schematic arrangement of the capacitors of the sensor on a semiconductor chip, FIG. 5 a schematic illustration of a first embodiment of a variable capacitor, FIG. 6 a schematic illustration of a second embodiment of a variable capacitor, and FIG. 7 a schematic illustration of a controllable reference voltage source.

The most important parts of a preferred embodiment of a sensor according to the invention are shown in FIG. 1. It is designed to determine the water content and the temperature of a gas.

For measuring the water content, the sensor comprises two measuring capacitors C1a, C1b. Such capacitors are known to the person skilled in the art. They e.g. possess interdigital electrodes, on top of which a polymer layer is arranged. The polymer layer absorbs, depending on air humidity, water, whereby it changes its dielectric constant. Hence, the capacitance of the capacitor is a function of the humidity to be measured.

The measuring capacitors C1a, C1b are part of a sigma-delta converter 1, which is described below in further detail.

According to FIG. 1, the sensor further comprises a temperature measuring unit 2 for temperature measurements, which generates a voltage signal Vtemp, which is a function of the environmental temperature. The voltage signal Vtemp is fed to the sigma-delta converter 1 and is processed in the manner further explained below.

Furthermore, the sensor comprises a reference voltage source 3, by means of which various auxiliary voltages for the operation of the sigma-delta converter 1 can be generated. The design of the reference voltage source 3 is described further below.

In addition to this, the sensor comprises a control unit 4, by means of which the functions of the individual parts can be monitored and coordinated, and which generates a clock signal for the sigma-delta converter, which defines the clock cycle of the sigma-delta converter 1. Control 4 can further comprise processing electronics which further process the output signal of the sigma-delta converter and deliver it to a suited interface.

Finally, the sensor has a voltage supply 5, the purpose of which it is to generate, from two operation voltages Vcc and Vss, an additional potential lying between these voltages, the analog ground.

The components shown in FIG. 1 are preferably all integrated on a semiconductor chip.

Figure 2:
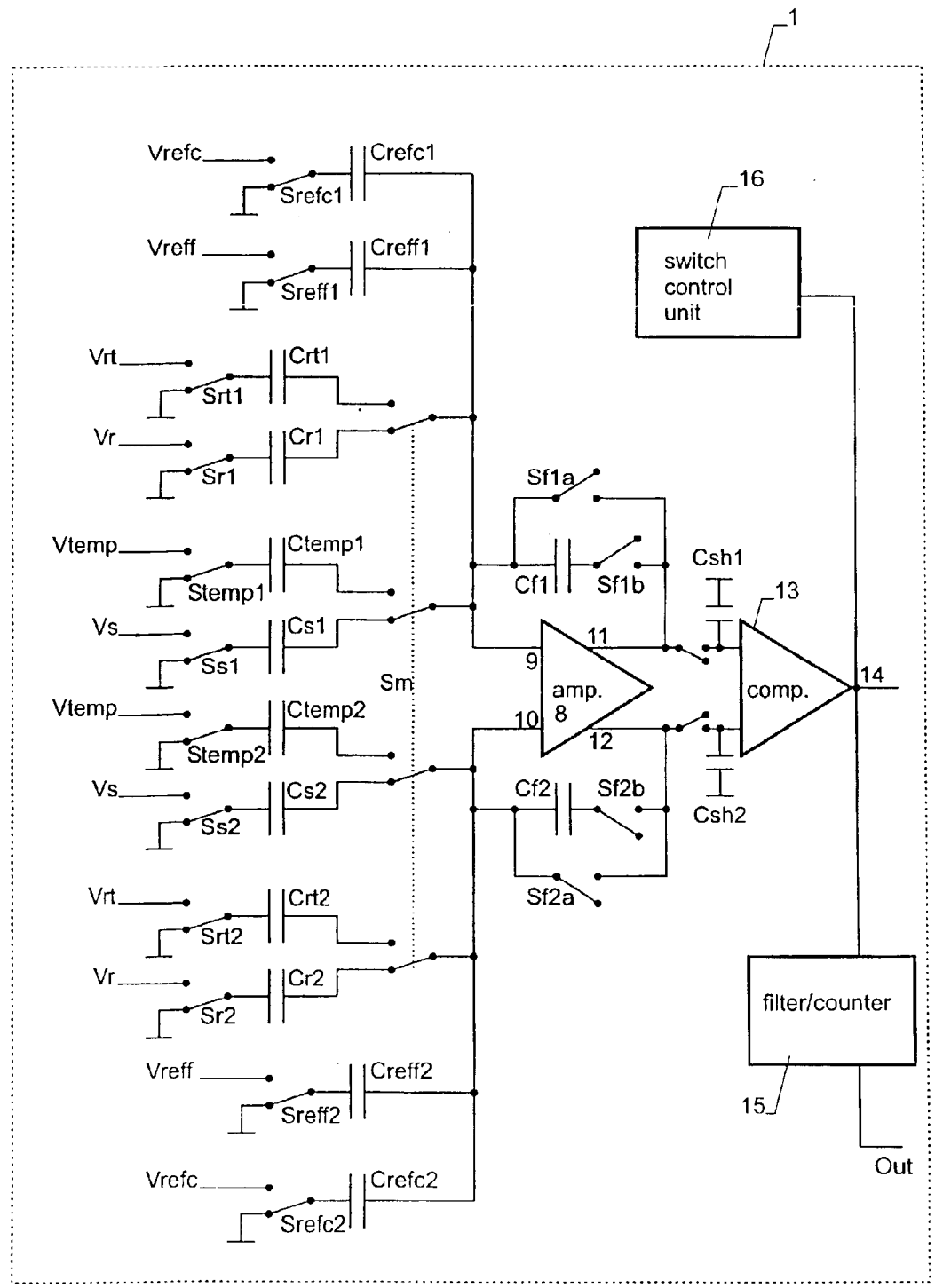

The design of the sigma-delta converter 1 is shown in FIG. 2. The converter shown here is a symmetrically designed converter with two channels that are being switched oppositely. For this purpose, it comprises an inverting two-channel amplifier 8 with two inputs 9, 10 and two outputs 11, 12.

Arranged in the feedback loop of each channel, there are feedback capacitors Cf1 and Cf2, respectively, which are bridged by switches Sf1a or Sf2a, and which can be switched off by means of switches Sf1b and Sf2b, respectively.

Several input capacitors are arranged at input 9, 10 of each channel. Tw input capacitors for each channel, the reference capacitors Crefc1, Creff1 and Crefc2, Creff2 are continuously connected to the amplifier input 9 or 10, respectively. Of four further input capacitors per channel, two can be connected at a time via a switch Sm to the amplifier input 9 or 10. In a first position of the switch Sm, a first compensation capacitor Cr1 and Cr2 and the measuring capacitor Cs1 or Cs2, respectively, are selected, in a second position a second compensation capacitor Crt1 and Crt2 and a temperature capacitor Ctemp1 and Ctemp2.

Arranged in front of each input capacitor is a switch Srefc1, Sreff1, Srt1, Sr1, Stemp1, Ss1 or Crefc2, Sreff2, Srt2, Sr2, Stemp2, Ss2, by means of which the input capacitors can selectively be connected to analog ground or to an input voltage Vrefc, Vreff, Vrt, Vr, Vtemp or Vs, respectively. The analog ground corresponds to the operating point of amplifier 8, i.e. to the potential that the outputs of the amplifier assume for closed switch Sf1a or Sf2a, respectively.

The outputs 11, 12 of the amplifier are led through sample-and-hold units with capacitors Csh1 and Csh2, respectively, and compared in a comparator 13. The output 14 of the comparator is fed to a counter 15, which generates the output signal Out of the sigma-delta converter in known manner by determining the number of transitions of the output signal of comparator 13 in a given measuring interval, wherein the measuring interval encompasses a number of $N \gg 1$ of clock cycles.

A switch control unit 16 controls the positions of the switches Srefc1, Sreff1, Srt1, Sr1, Stemp1, Ss1 and Crefc2, Sreff2, Srt2, Sr2, Stemp2, Ss2 at the inputs as well as the switches Sf1a, Sf1b and Sf2a, Sf2b in the feedback loops. For this purpose, it uses the clock signal from control unit 4 of the sensor as well as the output signal 14 of the comparator.

The principle of operation of sigma-delta converters is known to the person skilled in the art and does not need to be repeated here. For controlling the switches there are, however, different possibilities. In the present embodiment the switches are controlled as follows:

In the feedback loop corresponding switches of both channels are switched simultaneously and in the same phase, i.e. Sf1a in the same manner as Sf2a and Sf1b in the same manner as Sf2b.

The switches at the inputs of the input capacitors of the two channels are operated oppositely in such a manner that the two amplifier outputs 11, 12 have, in respect to analog ground, opposite sign. Hence, switch Ss1 is e.g. switched oppositely to Switch Ss2, Switch Sr1 oppositely to switch Sr2, etc. In the following we therefore only look at the upper channel: The switches of the lower channel are merely being switched oppositely to the corresponding switches of the upper channel.

The switches Srefc1, Sreff1 are preferably switched oppositely such that the charge flows in the reference capacitors Crefc1, Creff1 have opposite sign for equal reference voltages Vrefc and Vreff.

The switches Sr1 and Ss1 are switched oppositely such that the charge flows in the capacitors Cr1 and Cs1 have opposite sign for equal reference voltages Vr and Vs.

Switch Stemp1 is switched in the same way as switch Ss1, switch Srt1 in the same way as switch Sr1.

Switch Srefc1 is operated in the same way or oppositely to switch Ss1 depending on the output value of comparator 13. For this purpose, switch Srefc1 (and therefore also Sreff1) can e.g. be controlled depending on the output value of comparator 13, while switch Ss1 (and therefore also Sr1) is controlled independently of the output value of comparator 13.

The position of switch Sm is not selected by switch control unit 16 but by control unit 4 of the sensor. With its help it can be selected if the temperature or the humidity is to be measured by means of the sigma-delta converter.

In the following the input voltages of the sigma-delta converter and their purposes are discussed. Also here, only the upper channel of the sigma-delta converter is referred to because in the lower channel the same voltages are applied and the processes take merely place with opposite sign.

Vrefc, Vreff:

Vrefc is a roughly graded reference voltage and Vreff is a finely graded reference voltage. As described below, Vrefc can be varied in a large voltage range and Vreff in a small voltage range, wherein the small voltage range lies approximately at the center of the large voltage range. As the switches Srefc and Sreff1 are switched in opposite manner, the charges Vreff/Creff1 and Vrefc/Crefc1 are subtracted in each cycle of the sigma-delta converter in order to generate a reference charge $$Qref1 = Vrefc/Crefc1 - Vreff/Creff1,$$

which is charged to Cf1 or discharged from Cf1.

The reference charge Qref1 is, as described further below, used for calibrating the slope of the sigma-delta converter. By using a finely and a roughly graded reference voltage for generating the reference charge, it is possible to regulate the reference charge over a wide range in fine manner. As the capacitors Creff1 and Crefc1 have approximately the same size, the reference charge Qref1 is substantially proportional to the difference Vrefc−Vreff. Hence, Vrefc can be used for roughly setting Qref, while a fine correction is then possible with Vreff.

Vs, Vr:

Vr is a roughly graded compensation voltage and Vs is a finely graded measuring voltage. As described further below, Vs can be varied in a large voltage range and Vr in a small voltage range, wherein the small voltage range lies approximately in the center of the large voltage range. As the switches Ss1 and Sr1 are switched in opposite manner, the charges Vr/Cr1 and Vs/Cs1 are subtracted in each cycle of the sigma-delta converter in order to generate a measurement charge $$Qs1 = Vs/Cs1 - Vr/Cr1,$$

which is charged to Cf1 or discharged from Cf1.

Cs1 or the value Vs/Cs1 is the quantity that is to be determined by the sigma-delta converter. By variation of the voltages Vs and Vr it is therefore possible to substantially set an offset of the sigma-delta converter or to carry out an offset correction. Also here, by using a roughly and a finely graded voltage a fine regulation in a large range becomes possible. Even though the voltage Vs also has a multiplicative influence on the output signal, this influence is small, because it can only be varied over a small range, and it can be compensated by Vreff and Vrefc.

Vtemp, Vrt:

Vtemp is the voltage generated by temperature measurement unit 2, the value of which depends on the temperature to be measured. Vrt is a compensation voltage. As the switches Stemp and Srt are switched oppositely, the charges Vrt/Crt1 and Vtemp/Ctemp1 are subtracted in each cycle of the sigma-delta converter in order to generate a measurement charge $$Qtemp1 = Vtemp/Ctemp1 - Vrt/Crt1,$$

which is charged to Cf1 or discharged from Cf1.

Hence, it is also possible in this case to carry out an offset correction by varying Vrt.

As mentioned, for measuring the humidity, the switch Sm is in the lower position of FIG. 2. Hence, the components required for temperature measurement are inactive.

The voltages Vrefc, Vreff, Vs and Vr are set in a calibration measurement. Here, as mentioned, Vs and Vr primarily define the offset of the response curve of the sigma-delta converter and Vrefc and Vreff its slope.

A change of the capacitance of capacitor Cs1 or Cs2 can then be determined as a change in the output signal of the sigma-delta converter.

If the temperature is to be measured, switch Sm is brought into the upper position of FIG. 2. At the same time, the values of Vrefc and Vreff are changed, i.e. the reference voltage source 3 yields, depending on the current measuring mode (humidity, temperature) different values for Vrefc and Vreff. Also here, Vrt defines an offset of the response curve of the sigma-delta converter and Vrefc and Vreff its slope. A change in the temperature or the voltage Vtemp can then be determined as a change of the output signal of the sigma-delta converter.

Reference voltage source 3 is a further aspect of the present invention. For generating the voltages Vrefc and Vreff or Vs and Vc, respectively, reference voltage source 3 has to be able to generate roughly and finely graded voltages.

Figure 3:
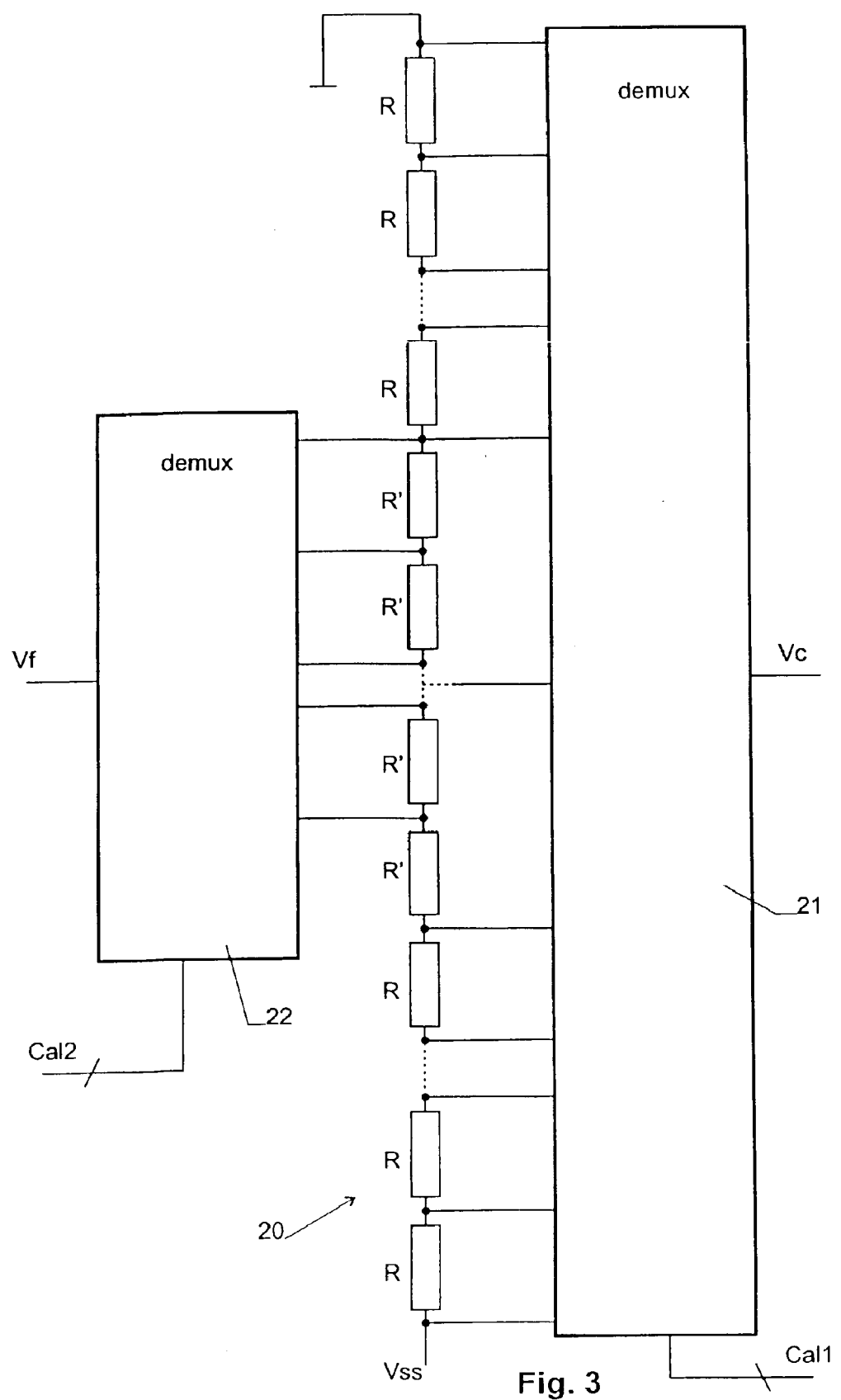

A circuit for generating such an voltage pair is shown in FIG. 3. It comprises a voltage divider 20, one end of which lies on analog ground and the other end of which is connected to the negative supply voltage Vss. In the present embodiment, it comprises approximately 120 resistors of the value R and 32 resistors of the value R', which are arranged in series, wherein first there are about 60 resistors of the value R, then the 32 resistors of the value R', and finally again approximately 60 resistors of the value R. The resistors are chosen such that R=32R'. The voltage difference between analog ground and the negative supply voltage Vss is approximately 1.23 Volt such that there is a voltage drop of approximately 10 mV over each resistor R and of approximately 0.32 mV over reach resistor R'.

A first analog demultiplexer 21 is provided for generating a roughly graded voltage Vc (corresponding e.g. to Vrefc or Vr). The inputs of the first demultiplexer 21 are taps between the resistors with value R as well one tap at each the beginning, the center and the end of the 32 resistors of value R'. A digital control input Cal1 defines which of the inputs of the demultiplexer 21 is connected to the output Vc. Hence, by means of control input Cal1, the voltage at output Vc can be set in steps of approximately 10 mV in a range between 0 and −1.23 V (in respect to analog ground). Since the first demultiplexer has not more than 128 inputs, control input Cal1 does not need more than 7 bits.

A second analog demultiplexer 22 is provided for generating a finely graded voltage Vf (which e.g. corresponds to Vreff or Vs). The inputs of the second demultiplexer 22 are arranged between the 32 resistors of value R'. A digital control input Cal2 defines which of the inputs is connected to output Vf. Hence, by means of control input Cal2, the voltage at output Vf can be set in steps of approximately 0.32 mV in a range of approximately −0.63 to −0.65 V (in respect to analog ground). As the second demultiplexer has 32 inputs, control input Cal1 does not need more than 5 bits.

The values applied to control inputs Cal1 and Cal2 are read from a non-volatile memory programmed during calibration of the sensor.

If, as in the present embodiment, more than two reference voltages have to be generated, a corresponding number of demultiplexers is to be provided, each of which can tap its voltages from the same voltage divider 20.

A second method for calibrating the sigma-delta converter, which can be carried out alone or in combination with the above method, is based on using variable capacitors or reference voltages and is described further below.

Figure 4:
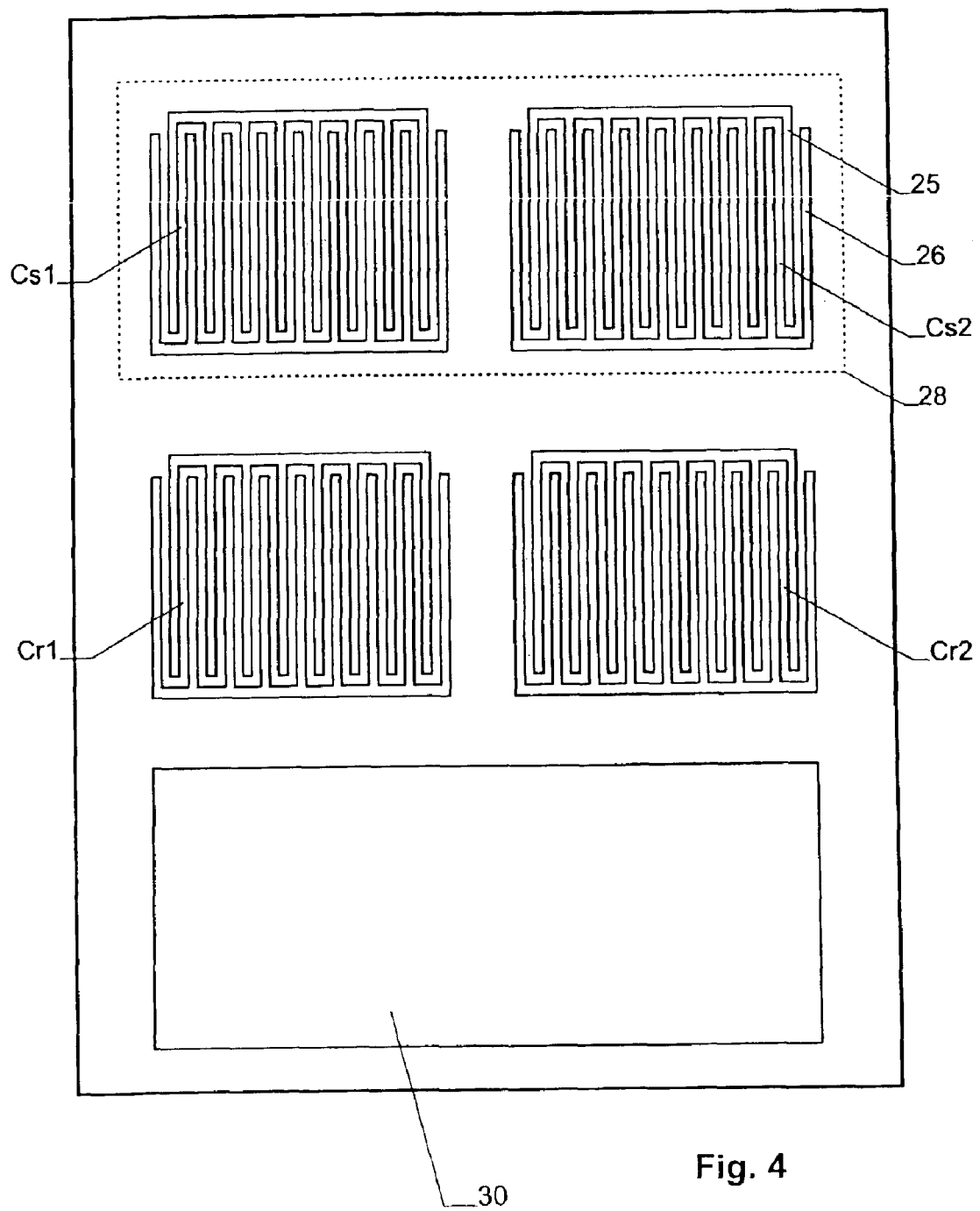

As already mentioned, the functional elements shown in FIG. 1 can all be integrated on a single semiconductor chip. This is schematically shown in FIG. 4.

The two measuring capacitors Cs1, Cs2 are arranged side by side on the semiconductor chip 25. They are formed by interdigital electrodes 26, 27 on top of which a polymer layer 28 (shown in dashed lines) is arranged.

The compensation capacitors Cr1 and Cr2 are built in the very same manner as the measurement capacitors Cs1, Cs2 and posses the same size, but they are not covered by a polymer layer but by a suited passivation layer, e.g. of glass. This has the advantage that certain causes of errors are reduced automatically because the switches Sc1 and Sr1 (and Sc2 and Sr2) are switched in opposite manner. For example, changes in capacitance caused by temperature changes of the semiconductor chip 25 compensate each other as long as Vs is approximately as large as Vc.

It is also possible that the passivation layer as well as the polymer layer 28 extend over all capacitors Cs1, Cs2, Cr1, Cr2, which simplifies production and furthermore allows a good protection of all capacitors. In this case, the layers over the individual capacitors differ, however, in thickness. For example, the passivation layer over the compensation capacitors Cr1, and Cr2 can be chosen to be so thick that the electric field does not extend into the polymer layer arranged on top of it.

The remaining elements of the sensor are schematically shown by a rectangle 30.

The sensor concept shown here can be changed in various ways. For example, it is also possible to use an asymmetric sigma-delta converter with only one amplifier channel—this affects the accuracy of the device but reduces the complexity of the circuit.

In the embodiment described above the sigma-delta converter has an analog measurement input Vtemp, by means of which the temperature is measured. This measurement input is, however, also suited for determining other voltage values or parameters, such as e.g. a pressure.

For a fine adjustment of the offset, in the above described embodiment Vs can be varied. Alternatively, voltage Vs can also be set to a fixed value and an additional input capacitor with variable input voltage can be provided for each channel, which feeds a charge contribution that is much smaller than the one from Cs.

In the embodiment of FIG. 2, the measurement capacitors Cs1 and Cs2 were used as input capacitors. It is, however, also possible to use the measurement capacitor as feedback capacitor.

Figure 5:
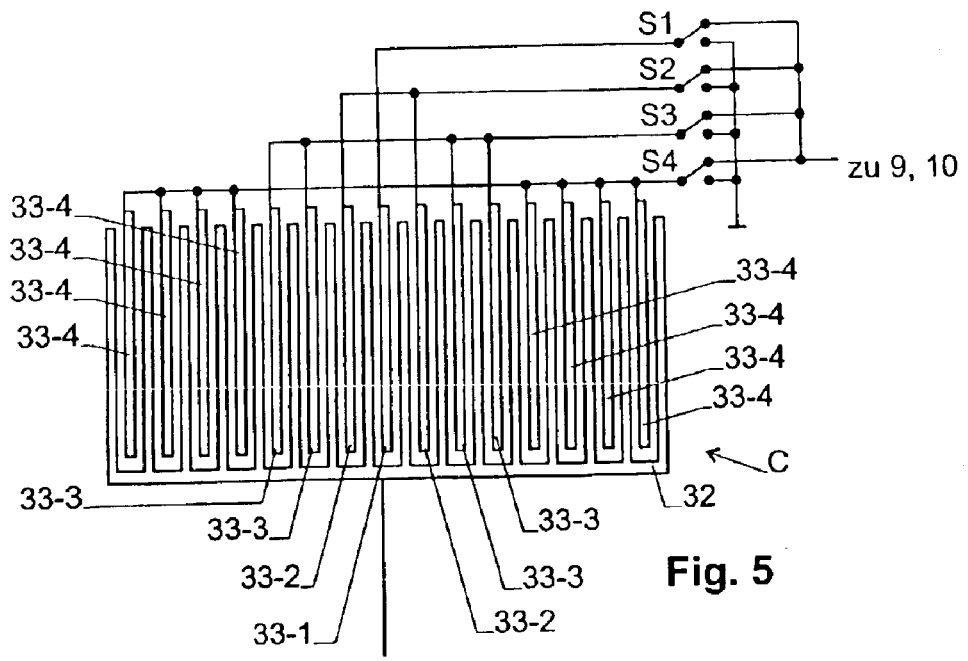

Alternatively or in addition to the above methods for calibration, one or more capacitors in the sigma-delta converter can be designed to be variable. This is illustrated in FIG. 5. As in FIG. 4, a capacitor C, e.g. a measurement capacitor Cs1 or Cs2, is formed by interdigital electrodes. One side of the capacitor C consists of a first, broad interdigital electrode 32, while the other side consists of several sub-electrodes 33-1, 33-2, 33-3, 33-4. Sub-electrode 331-1 comprises one electrode finger, sub-electrode 33-2 two, sub-electrode 33-3 four and sub-electrode 33-4 eight. In this way capacitor C is divided into several sub-capacitors C1, C2, C3 and C4, wherein the number of interdigital electrodes of the i-th sub-capacitor Ci is equal to $2^i$, i.e. the sizes of the sub-capacitors have binary weights.

The sub-electrodes 33-1 . . . 33-4 are selectively connected to input 9 or 10, respectively, of amplifier 8 or to analog ground via switches S1 . . . S4. The switches S1 . . . S4 are controlled by the control units 4 and 16. Depending on the position of the switches, the capacitance of capacitor C can be increased in steps of ¹⁄₁₆ of the total capacitance.

The attribution of the interdigital electrodes to the sub-capacitors is symmetric to a central line of capacitor C running parallel to the interdigital electrodes. This has the advantage that a possible linear capacity gradient over the capacitor has no influence on the capacitance of the sub-capacitors.

Figure 6:
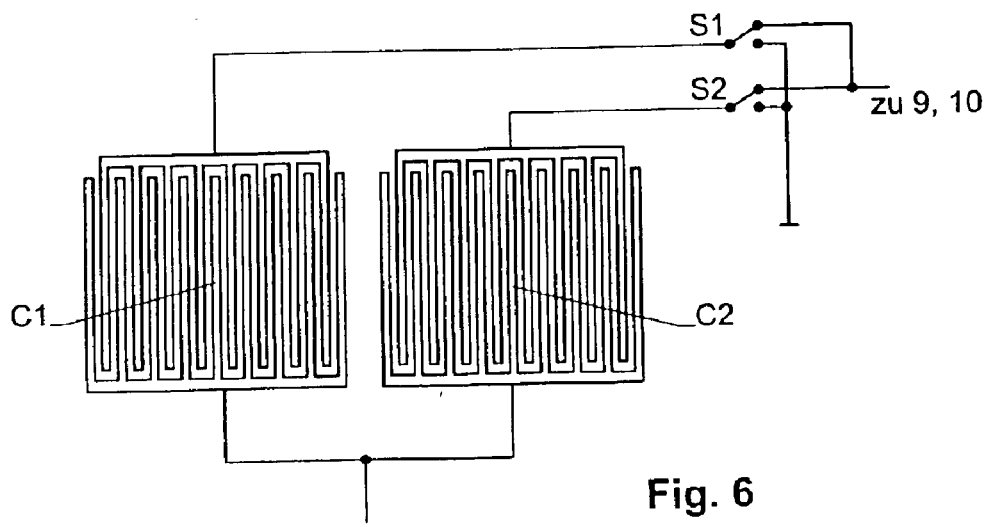

A simpler embodiment of a variable capacitor is shown in FIG. 6. Here, the capacitor has merely been divided into two equal sub-capacitors C1, C2. The sub-capacitors are interconnected at one of their terminals while the other terminals are connected via the switches S1, S2 either to the input 9 or 10, respectively, of amplifier 8 or to analog ground. The switches S1, S2 are again controlled by the control units 4 and 16. One of the switches can also be dispensed with if only two different values of capacitance are desired. In this case one of the sub-capacitors is used continuously while the other is only added if required.

The embodiments of FIGS. 5 and 6 allow to set the capacitance of a capacitor in 2 or 16 steps, respectively. This is enough for a rough calibration, but for a fine calibration additional measures have to be taken.

For this purpose, a technique can be used that can be applied generally in sigma-delta converters and the application of which is not limited to sensors or to the embodiments of FIGS. 1–4.

In this technique it is exploited that a sigma-delta converter carries out a summation, average or filtering of charges over a plurality of clock cycles. If, as e.g. shown in FIG. 4, the output filter is a counter 15, this counter counts the number of charge units transported through the converter during a measuring interval of N>>1 clock cycles.

If one of the capacitors of the sigma-delta converter is now, e.g. as in FIG. 6, divided into two sub-capacitors C1 and C2, it is e.g. possible to operate C1 and C2 in parallel during n measurement cycles. During the remaining N-n measurement cycles, only C1 is in operation, while C2 is connected to ground via switch S2. Over the whole measuring interval, there results therefore an average effective capacitance of C1+C2·n/N for the capacitor. As N is much larger than 1, it is possible, in this manner, to adjust the capacitance of the capacitor very finely. Switching the switch Sc1 or Sc2 between the individual clock cycles does not cause any electric noise because the inputs of the amplifier are substantially at ground potential such that a switching to ground does not cause a voltage jump.

This technique can be used for one or more of the input or feedback capacitors in a sigma-delta converter in order to set the effective capacitance of this capacitor and therefore to correct the offset or slop of the converter. As the effective capacitance of the capacitor can be set very finely, it may, in some situations, not be necessary anymore to use adjustable reference voltages as they are used in the embodiment of FIG. 2.

Figure 7:
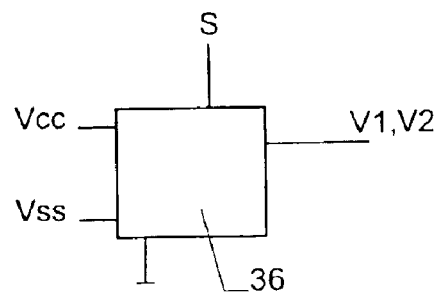

This technique can also be used, in corresponding manner, for reference voltages. For this purpose, a reference voltage as schematically illustrated in FIG. 7 is used. It possesses a binary control input S, depending on which it generates two ifferent reference voltages V1 and V2.

If one of the reference voltages at the input capacitors of a sigma-delta converter, such as the reference voltage Vs or Vrefc in the embodiment of FIG. 2, is generated with the circuit of FIG. 7, it is e.g. possible to generate the voltage V1 during n measurement cycles of a measuring interval, while the voltage V2 is generated during N-n measurement cycles. Over the whole measurement interval, there therefore results an average effective voltage of $(n \cdot V1+(N-n) \cdot V2)/N$. Hence, similar to the example with a variable capacitor, the effective voltage can be adjusted finely.

This technique can be used for any input voltage or reference voltage of a sigma-delta converter and it can replace or complement the solution shown in FIGS. 2 and 3.

The technique of the variable capacitors or reference voltages is not limited to capacitors or reference voltages that can be switched between only two values. It is also possible to operate the capacitor of FIG. 5 with this technique, wherein the capacitance of the capacitor is switched back and forth between those two settings that come closest to the desired effective value.

While, in the present application, there are described preferred embodiments of the invention, it is to be distinctly understood that the invention is not limited thereto but may be otherwise practiced within the scope of the following claims.

What is claimed is:

1. A sensor for determining at least one parameter with a sigma-delta-converter comprising Switched capacitors comprising at least two input capacitors and at least one feedback capacitor, wherein at least two of the capacitors is a measuring capacitors designed so that their respective capacity depends on the parameter to be determined; and two oppositely switched amplifier channels wherein one of said measuring capacitors is arranged in each amplifier channel.

2. The sensor of claim 1 wherein the measuring capacitors are input capacitors.

3. The sensor of claim 1 wherein the measuring capacitor comprises a dielectric the dielectric constant of which depends on a parameter to be measured, and wherein the measuring capacitor comprises interdigital electrodes on top of which the dielectric is arranged.

4. The sensor of claim 1 wherein the two measuring capacitors are of substantially equal design and are arranged symmetrically in the measuring channels.

5. The sensor of claim 1 wherein the sigma delta converter comprises at least one amplifier stage with an input and a first and a second group of input capacitors, which can be selectively connected to the input by means of switches so that measurements can be carried out with the first as well as the second group.

6. The sensor of claim 5 wherein at least one capacitor of the first group is connected to an analog measurement input and the measuring capacitor is part of the second group, and the sensor comprises a temperature measuring unit connected to the analog measuring input.

7. A sensor for determining at least one parameter with a sigma-delta-converter comprising Switched capacitors comprising at least two input capacitors and at least one feedback capacitor, wherein at least two of the capacitors are measuring capacitors designed so that their respective capacity depends on the parameter to be determined; and two oppositely switched amplifier channels wherein one of said measuring capacitors is arranged in each amplifier channel wherein at least one of the input capacitors is a compensation capacitor and the compensation capacitor can be connected to a compensation potential via a compensation switch and the measuring capacitor to a sensor potential via a sensor switch, wherein the compensation switch is switched substantially in opposite manner to the sensor switch.

8. The sensor of claim 7 wherein the compensation capacitor and the measuring capacitor have substantially the same capacitance, are arranged on a common substrate, and comprise interdigital electrodes.

9. A sensor for determining at least one parameter with a sigma-delta-converter comprising Switched capacitors comprising at least two input capacitors and at least one feedback capacitor, wherein at least two of the capacitors are measuring capacitors designed so that their respective capacity depends on the parameter to be determined; and two oppositely switched amplifier channels wherein one of said measuring capacitors is arranged in each amplifier channel wherein at least one of the measuring capacitors consists of at least two parallel sub-capacitors at least one of which can selectively be added by means of control unit.

10. The sensor of claim 9 wherein the measuring capacitor comprises interdigital electrodes, wherein a first part of the interdigital electrodes is attributed to the first sub-capacitor and a second part of the interdigital electrodes to the second sub-capacitor, and the attribution of the interdigital electrodes is symmetric to a central line of the measuring capacitor running parallel to the interdigital electrodes.

11. The sensor of claim 10 wherein the measuring capacitor comprises more than two sub-capacitors, wherein the number of interdigital electrodes attributed to the i-th sub-capacitor is proportional to $2^i$.

12. A sensor for determining at least one parameter with a sigma-delta converter, said sigma-delta converter comprising switched capacitors comprising at least two input capacitors and at last one feedback capacitor;

two oppositely switched amplifier channels; and at least two measurement capacitors arranged as two of said switched capacitors in each of said amplifier channels, wherein the capacity of each measurement capacitor depends on the parameter to be determined.

* * * * *